(12) United States Patent
Clarke

(10) Patent No.: US 6,703,938 B1
(45) Date of Patent: Mar. 9, 2004

(54) ELECTRICAL PANEL SAFETY MONITOR

(75) Inventor: Roger S. Clarke, Lititz, PA (US)

(73) Assignee: Automatic Timing & Controls, Inc., Lancaster, PA (US)

( * ) Notice: Subject to any disclaimer, the term of this patent is extended or adjusted under 35 U.S.C. 154(b) by 0 days.

(21) Appl. No.: 10/259,679

(22) Filed: Sep. 27, 2002

(51) Int. Cl.[7] .............................................. G08B 21/00
(52) U.S. Cl. ....................... 340/664; 340/638; 340/639; 340/815.45; 340/691.7; 340/687; 340/659
(58) Field of Search ................................ 340/664, 659, 340/657, 662, 687, 691.7, 691.8, 693.5, 638, 639, 660, 661, 663, 650, 651, 652, 815.45

(56) References Cited

U.S. PATENT DOCUMENTS

| | | | | | |
|---|---|---|---|---|---|
| 4,004,201 A | * | 1/1977 | DePuy | ........................ | 340/638 |
| 4,333,049 A | * | 6/1982 | Yui et al. | ..................... | 324/102 |
| 4,556,882 A | * | 12/1985 | Brifman et al. | ........ | 340/825.06 |
| 4,760,384 A | * | 7/1988 | Vila-Masot | ................. | 340/638 |
| 5,172,289 A | * | 12/1992 | Zelm | ........................... | 340/648 |
| 5,270,658 A | * | 12/1993 | Epstein | ....................... | 340/638 |
| 5,353,014 A | * | 10/1994 | Carroll et al. | .............. | 340/638 |
| 5,546,266 A | * | 8/1996 | Mackenzie et al. | ......... | 340/638 |
| RE36,317 E | * | 9/1999 | Arratia | ....................... | 340/638 |
| 5,986,557 A | * | 11/1999 | Clarke | ........................ | 340/638 |

* cited by examiner

*Primary Examiner*—Jeffery Hofsass
*Assistant Examiner*—Daniel Previl
(74) *Attorney, Agent, or Firm*—Fay, Sharpe, Fagan, Minnich & McKee, LLP

(57) ABSTRACT

An electrical safety monitor (20) includes a housing (50) with a display face (70) and a securing section (54) that connects with an electrical panel (62). Electrical circuitry (30) is contained in the housing (50). The electrical circuitry (30) communicates with electrical lines (L1, L2, L3, GND) of the panel (62), and defines high impedance electrical paths between pairs of electrical lines (L1, L2, L3, GND). Each high impedance path includes a positive light emitting diode (D1, D2, D3, D4) arranged to draw current from a line carrying a positive electrical energy potential and a negative light emitting diode (D5, D6, D7, D8) arranged to draw current from a line carrying a negative electrical energy potential relative to the positive electrical energy potential. The positive and negative light emitting diodes are disposed on the display face (70) of the housing (50). Each light emitting diode produces light responsive to current flow in a high impedance path that includes the light emitting diode.

24 Claims, 7 Drawing Sheets

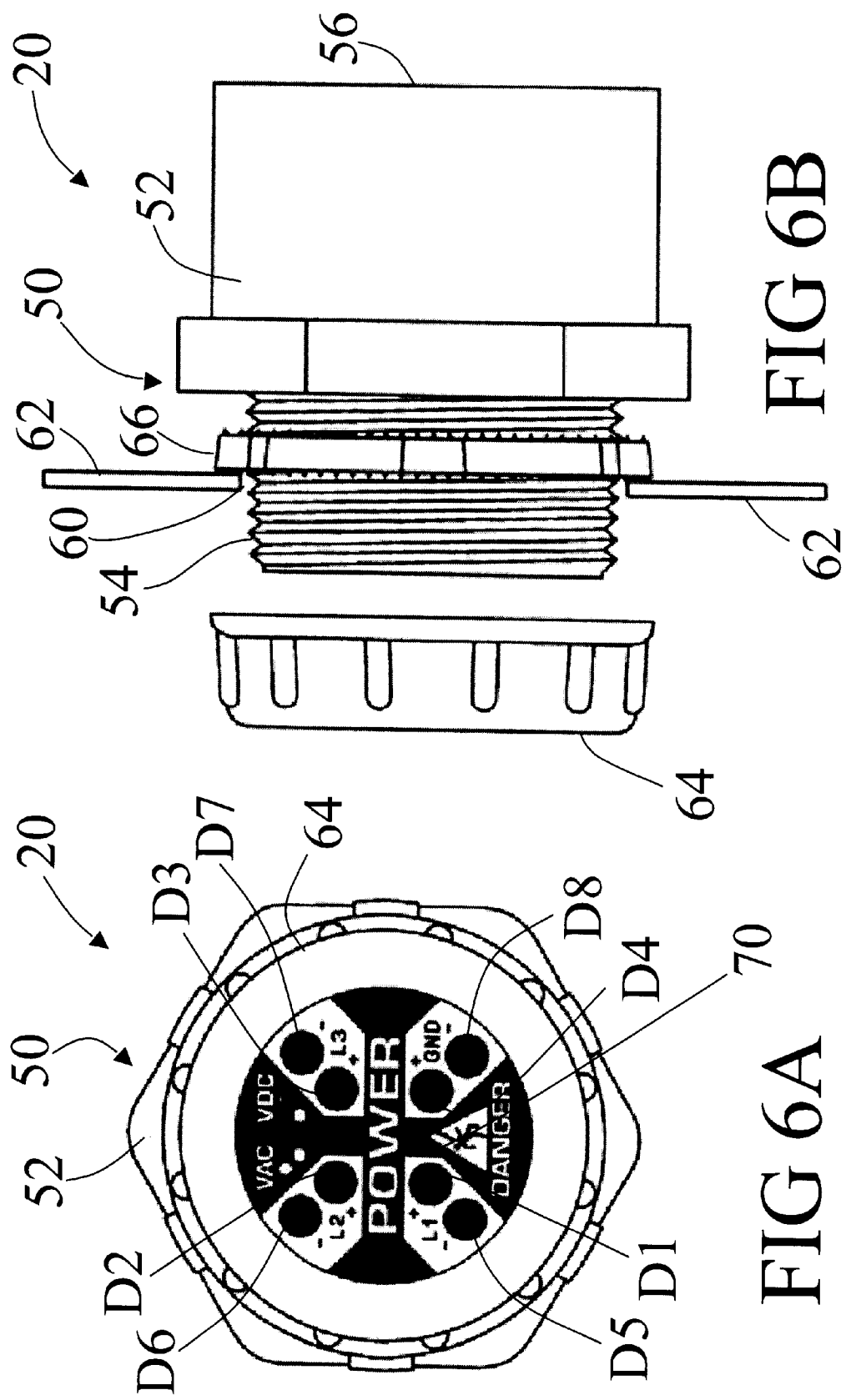

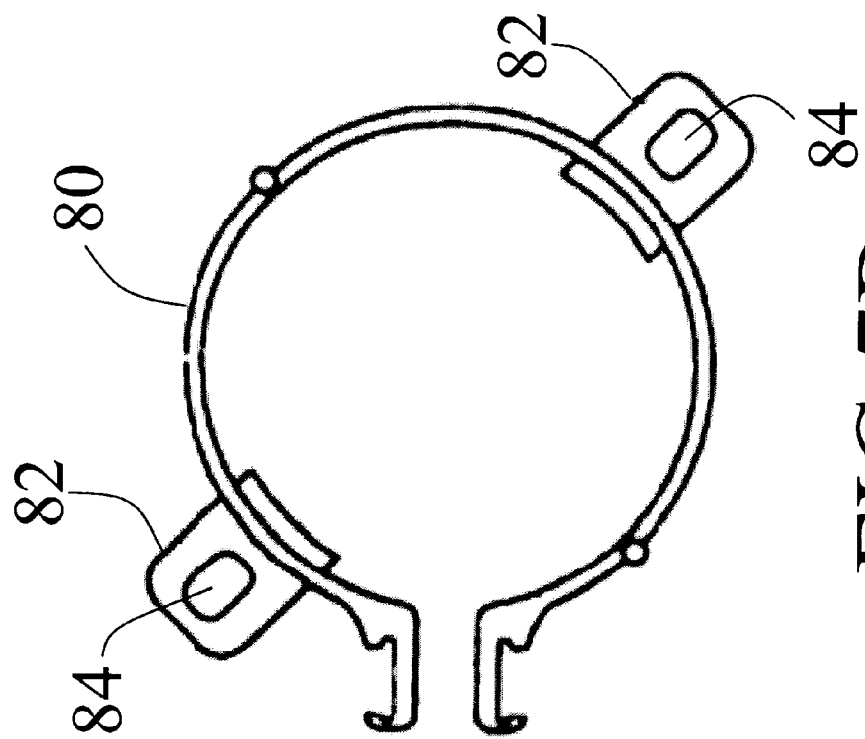
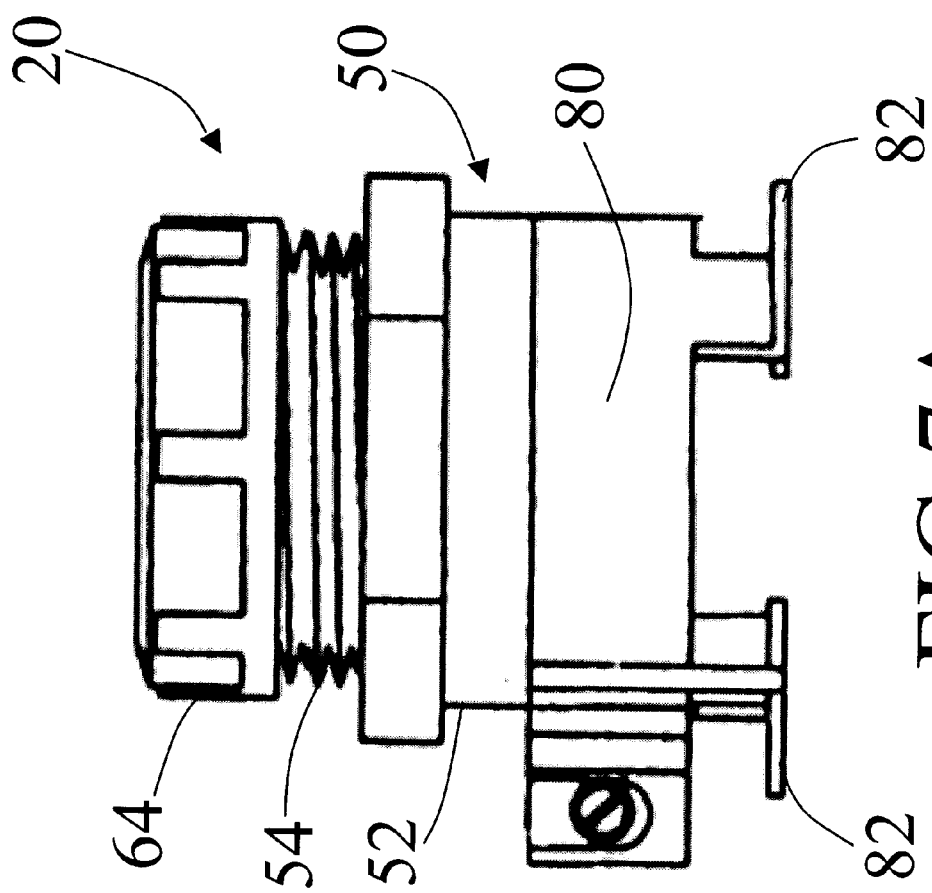
FIG 7A
FIG 7B

ELECTRICAL PANEL SAFETY MONITOR

BACKGROUND

The following relates to the electrical power arts. It particularly relates to monitoring a safe electrical disconnection of a high voltage circuit for servicing, and will be described with particular reference thereto. However, the following will also find application in routine monitoring of electrical line voltages and in other aspects of electrical safety.

To ensure safety during servicing of electrical systems and circuits which carry high voltages, a "lockout/tagout" procedure is typically followed. A circuit breaker or ON/OFF switch that delivers power to the circuit to be serviced is opened or disengaged to disconnect electrical power from the circuit, and the breaker is physically locked into the opened or disengaged position using a padlock or other device (the "lockout"). Additionally, the servicing technician affixes a tag to the physically locked breaker that provides information such as the technician's identity and contact information, service authorization information, and the like (the "tagout"). The tag typically is bright red or otherwise prominently displayed, and includes a plain language warning that only the installing technician is authorized to remove the lockout/tagout and reenergize the circuit.

The lockout/tagout procedure greatly reduces the possibility of human error causing inadvertent application of power to the circuit under service. However, safety can be compromised even when the lockout/tagout procedure is properly followed, due to various potential sources of dangerously high voltages in the isolated circuit. For example, potential unexpected sources of d.c. energy include line capacitance, bypass capacitors, or power factor correction banks. Potential unexpected sources of a.c. energy include standby power generators, motor back-EMF, or human operation of an associated switch. Moreover, power ON/OFF switches or circuit breakers are not immune to failure, and the locked out breaker could potentially still be transmitting power.

Recognizing that the most dangerous power panel or box can be the one believed to be at zero energy potential, the Occupational Safety and Health Administration (OSHA) has issued regulation OSHA 1910.147 entitled "Control of Hazardous Energy (Lockout/Tagout)" which includes identification of residual or stored energy as a hazard. OSHA 1910.147 requires that electrical isolation be verified after lockout/tagout. Furthermore, it requires that the verification of isolation continue throughout the electrical servicing if there is a possibility of reaccumulation of hazardous levels of stored energy.

In the past, electrical meters, neon indicators, or incandescent light bulbs have been used to verify electrical isolation. However, these devices have a number of problems. One problem is a limited operating range. Hazardous energy potentials begin in the vicinity of 30 volts to 40 volts. A commercial three-phase line supply can be as high as 460 vac line-to-line in the United States, and up to 600 vac in Canada. A simple rectifier on a 600 vac line could produce an 848 vdc potential. Past neon indicators and incandescent bulbs do not operate over such a wide range of potential stored voltages.

Additionally, these indicators do not provide information about the hazard. There is no indication of the type of stored energy potential (a.c. or d.c.) or the polarity in the case of a d.c. potential. Such information can be useful for identifying and eliminating the source.

Another problem with these indicators is inconvenience. Typically, the technician inserts the indicator between each of the various line combinations. For a three-phase circuit there are three lines (four including a neutral in a "wye" configuration) plus a circuit ground, and so a large number of combinations should be tested. Manual testing of these various combinations provides many opportunities for the servicing technician to inadvertently miss a test.

Yet another problem with past indicators is that they do not provide a continuous and intuitive visual indication of potential hazards. These devices are typically not configurable to provide continuous monitoring of all possible line combinations throughout servicing, as required for compliance with OSHA 1910.147.

Still yet another problem with past indicators is that the electrical panel is opened to provide access for the testing. This provides an opportunity for contact by the technician or others with any hazardous voltages contained therein.

The following contemplates an improved apparatus and method that overcomes the aforementioned limitations and others.

BRIEF SUMMARY

According to one aspect, an electrical safety monitor is disclosed for monitoring electrical energy potentials of electrical lines of an electrical panel. A housing includes a display face and a securing section that connects with the electrical panel. Electrical circuitry is contained in the housing. The electrical circuitry communicates with the electrical lines, and defines high impedance electrical paths between pairs of electrical lines of the electrical panel. Each high impedance path includes a positive light emitting diode arranged to draw current from a line carrying a positive electrical energy potential and a negative light emitting diode arranged to draw current from a line carrying a negative electrical energy potential relative to the positive electrical energy potential. The positive and negative light emitting diodes are disposed on the display face of the housing. Each light emitting diode produces light responsive to current flow in a high impedance path that includes the light emitting diode.

According to another aspect, an electrical safety monitor is disclosed for monitoring electrical energy potentials of electrical lines. A plurality of solid-state light-emitting devices are disposed in a human-viewable arrangement. Each light emitting device electrically communicates with a selected electrical line and produces a light output indicative of an electrical energy potential between the selected electrical line and at least one other line.

According to yet another aspect, a method is provided for providing warning of a hazardous electrical voltage on a circuit. High impedance rectifying paths are arranged between electrical lines of the circuit. The high impedance rectifying paths include light emitting diodes. Each light emitting diode produces light responsive to a current flowing in a high impedance rectifying path that includes the light emitting diode. A display that includes the light emitting diodes is monitored to detect a hazardous electrical voltage.

One advantage resides in providing monitoring over a wide range of stored electrical energy potentials, from the lowest hazardous levels of about 30 volts to 40 volts up to at least about a kilovolt.

Another advantage resides in providing a convenient visual indication of a detected stored electrical potential level and type (a.c. or d.c.), as well as polarity information for d.c. potentials.

Another advantage resides in simultaneous automatic testing of all line combinations in a three-phase line supply, including line potentials respective to ground.

Yet another advantage resides in providing a continuous and intuitive visual indication of potential stored electrical energy hazards for every line combination in a three-phase line supply throughout the servicing process.

Still yet another advantage resides in providing verification of electrical circuit isolation without opening or otherwise accessing the electrical panel.

Numerous additional advantages and benefits will become apparent to those of ordinary skill in the art upon reading the following detailed description of the preferred embodiments.

BRIEF DESCRIPTION OF THE DRAWINGS

The invention may take form in various components and arrangements of components, and in various process operations and arrangements of process operations. The drawings are only for the purpose of illustrating preferred embodiments and are not to be construed as limiting the invention.

FIG. 6A shows a front view of the electrical safety monitoring device of FIG. 1.

FIG. 6B shows a partially exploded side view of the electrical safety monitoring device of FIG. 1 and its positioning in a panel knockout conduit.

FIG. 7A shows a side view of the electrical safety monitoring device of FIG. 1 mounted using a surface mount bracket.

FIG. 7B shows a front view of the surface mount bracket of the arrangement of FIG. 7A.

DETAILED DESCRIPTION OF THE PREFERRED EMBODIMENTS

Figure 1:
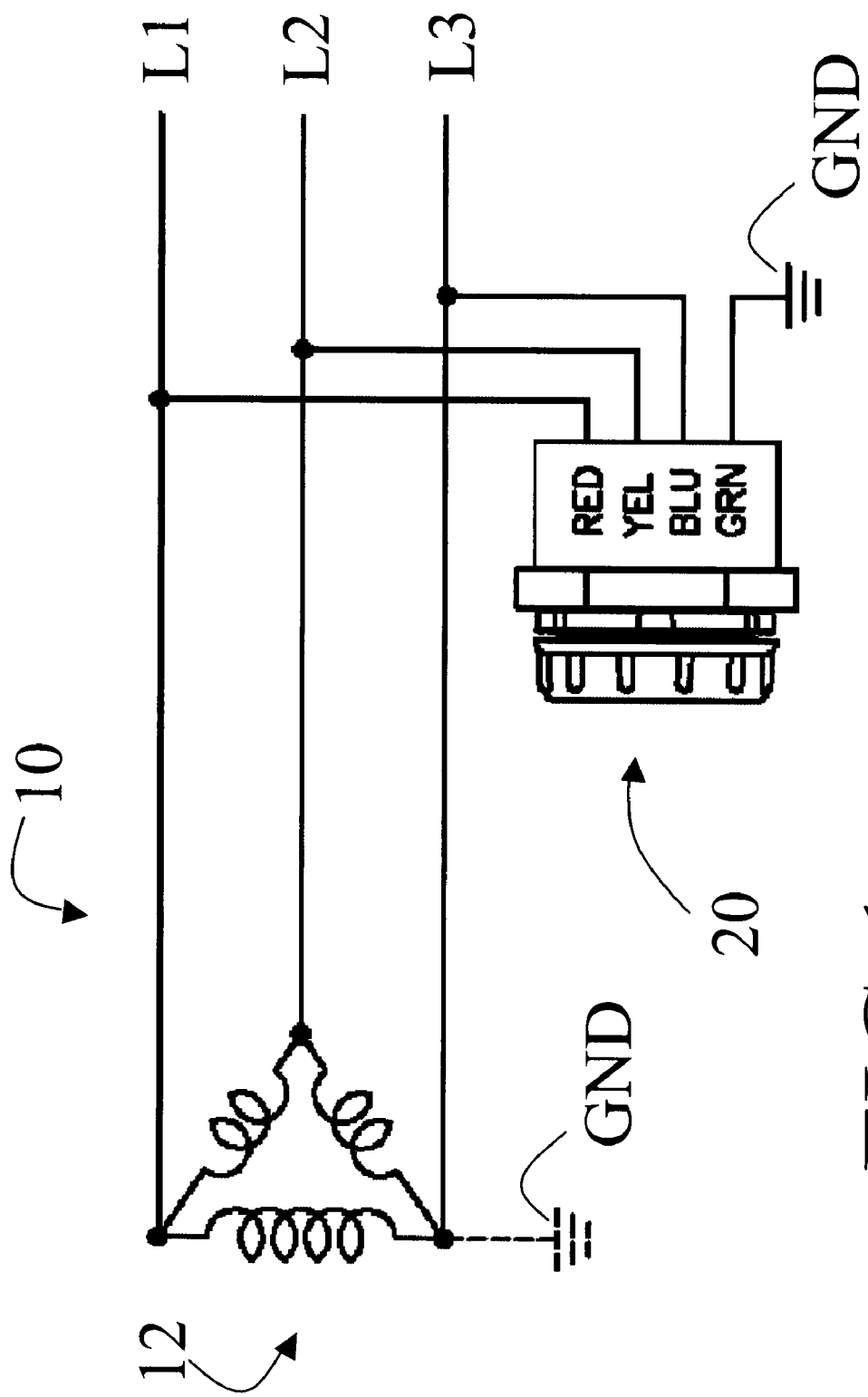
FIG. 1 shows an electrical schematic of a three-phase delta-connected electrical power circuit under service, along with an electrical safety monitoring device.

With reference to FIG. 1, a circuit 10 to be serviced includes a delta-connected three-phase load 12 that is driven through lines L1, L2, L3 by three-phase power relative to a ground potential GND. The three-phase power is presently disconnected via a circuit breaker or ON/OFF switch (not shown) such that the lines L1, L2, L3 are intended to be electrically isolated and at zero potential, in preparation for electrical service.

However, it is understood that one or more of the lines L1, L2, L3 may carry substantial or even lethal d.c. or a.c. electrical energy potentials due to charged capacitances in the load 12, undischarged power factor correction banks, standby power generators, motor back-EMF voltages, power sources that inadvertently remain energized and/or connected to the circuit 10 through human error or mechanical failure, or the like. These electrical energy potentials may exist between the lines L1, L2, L3 and/or between one or more of the lines L1, L2, L3 and the ground potential GND.

Figure 2:
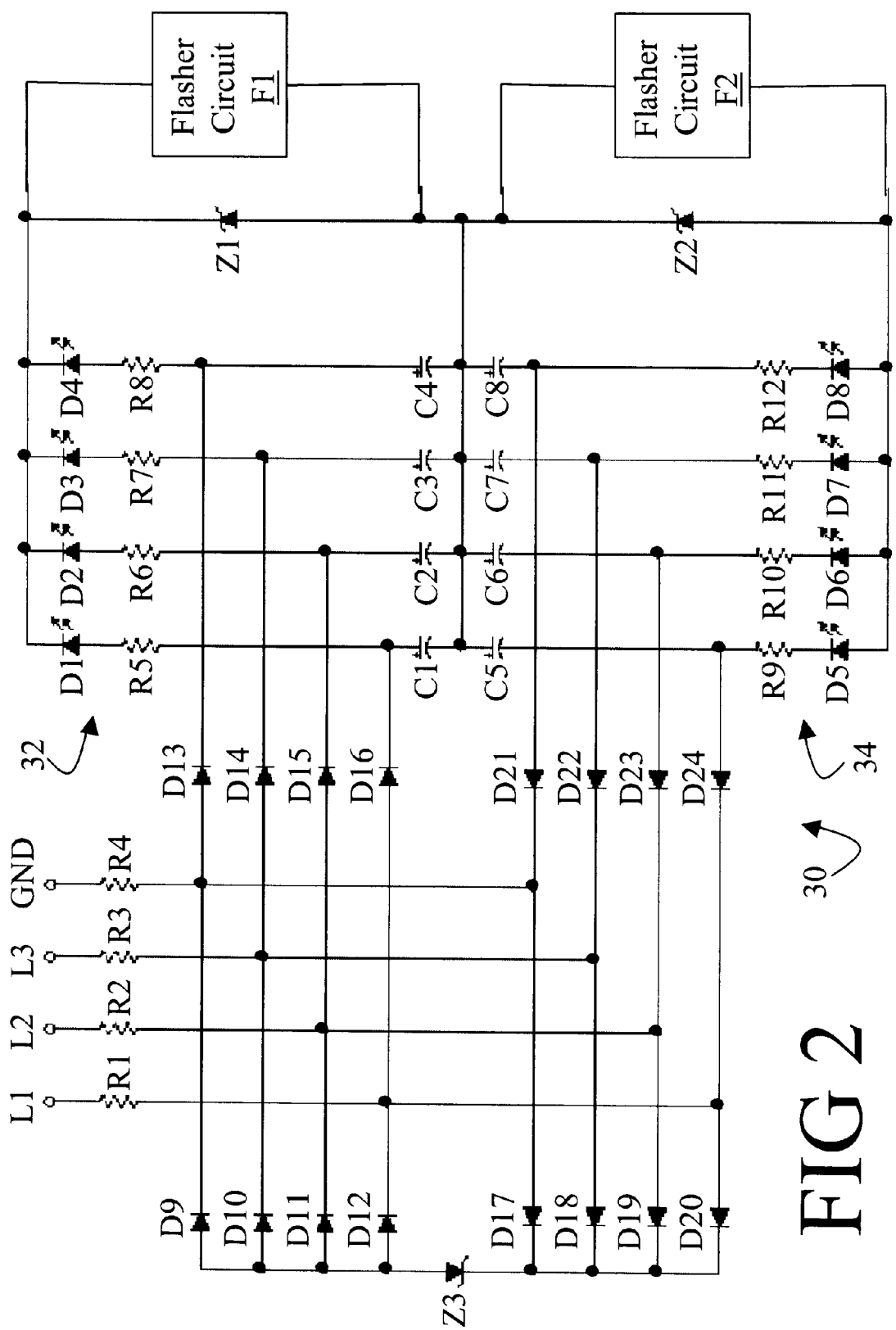
FIG. 2 shows an electrical schematic of circuitry of the electrical safety monitoring device of FIG. 1.

With continuing reference to FIG. 1 and with further reference to FIG. 2, an electrical safety monitoring device 20 monitors the lines L1, L2, L3 and the ground potential GND to detect hazardous energy potentials. The electrical safety monitoring device 20 includes electrical circuitry 30 shown in FIG. 2. The circuitry 30 includes a plurality of light emitting devices which are preferably light emitting diodes. Specifically, the circuitry 30 includes light emitting diodes D1, D2, D3, D4, D5, D6, D7, D8, and corresponding capacitances C1, C2, C3, C4, C5, C6, C7, C8. The light emitting diodes D1, D2, D3, D4, D5, D6, D7, D8 and capacitances C1, C2, C3, C4, C5, C6, C7, C8 are protected by zener diodes Z1, Z2 which limit voltages over these elements. Additional protective elements include a third zener diode Z3 and diodes D9, D10, D11 D12, D17, D18, D19, D20 which limit voltage over the capacitances C1, C2, C3, C4, C5, C6, C7, C8.

The light emitting diodes D1, D2, D3, D4, D5, D6, D7, D8, and corresponding capacitances C1, C2, C3, C4, C5, C6, C7, C8 are separated into two groups. A first group 32 of light emitting diodes including the light emitting diodes D1, D2, D3, D4, along with corresponding capacitors C1, C2, C3, C4 and resistors R5, R6, R7, R8. The first group 32 is arranged to draw current from positively charged lines and to produce light indicating lines with a positive potential with respect to one or more other lines. A second group 34 of light emitting diodes including the light emitting diodes D5, D6, D7, D8, along with corresponding capacitors C5, C6, C7, C8 and resistors R9, R10, R11, R12. The second group 34 is arranged to draw current from negatively charged lines and to produce light indicating lines with a negative potential with respect to one or more other lines.

The potentials on the lines L1, L2, L3 and the ground potential GND are fed into the circuitry 30 via high impedance resistances R1, R2, R3, R4, respectively. In a preferred embodiment, the resistances R1, R2, R3, R4 are each 470 kilo-ohms to ensure a high input impedance of the circuitry 30 to the circuit 10 under service. The high input impedance pets hazardous electrical energy from entering the electrical safety monitoring device 20 and allows closely spaced low voltage and low current components to be used in constructing the circuitry 30.

In operation, high impedance paths are defined between each pair of the lines L1, L2, L3, and between each of the lines L1, L2, L3 and the ground potential GND.

For example, if an electrical potential exists between L1 and GND with L1 being positive relative to GND, then a high impedance path including resistance R1, a diode D16, capacitances C1, C8, a diode D21, and resistance R4 conducts current flowing from L1 to GND. The current flow charges the capacitance C1 which is associated with the light emitting diode D1 of the first or positive group 32, and also charges the capacitance C8 which is associated with the light emitting diode D8 of the second or negative group 34.

The capacitor C1 charges until it reaches a threshold voltage which triggers a discharge or flash circuit F1 associated with the light emitting diodes D1, D2, D3, D4 of the first group 32, at which point F1 switches from a high impedance state to a low impedance state. In a preferred embodiment, the threshold voltage for triggering the flash circuit F1 is about 5 volts. The flash circuit F1 in its low impedance state discharges the capacitor C1 through the light emitting diode D1, and the discharge current causes the light emitting diode D1 to produce light.

Similarly, the capacitor C8 charges until it reaches a threshold voltage which triggers a flash circuit F2 associated with the light emitting diodes D5, D6, D7, D8 of the second group 34, at which point F2 switches from a high impedance state to a low impedance state. Preferably, the flash circuit F2 is substantially similar to the flash circuit F1, and also has a threshold voltage of about 5 volts. The flash circuit F2 in its low impedance state discharges the capacitor C8 through the light emitting diode D8, and the discharge current causes the light emitting diode D8 to produce light.

On the other hand, if an electrical potential exists between GND and L1 with GND being positive relative to L1, then a high impedance path including resistance R4, a diode D13, capacitances C4, C5, a diode D24, and resistance R1 conducts current flowing from GND to L1. The current flow charges the capacitance C4 which is associated with the light emitting diode D4 of the first or positive group 32, and also charges the capacitance C5 which is associated with the light emitting diode D5 of the second or negative group 34.

The capacitor C4 charges until it reaches the threshold voltage of the flash circuit F1, at which point F1 switches to its low impedance state, discharges the capacitor C4, and causes the light emitting diode D4 to produce light. Similarly, the capacitor C5 charges until it reaches the threshold voltage of the flash circuit F2, at which point F2 switches to its low impedance state, discharges the capacitor C5, and causes the light emitting diode D5 to produce light.

The various high impedance paths of the circuitry 30 are summarized in Table I.

TABLE I

High impedance paths

| Positive Line | Negative Line | Charging path portion | Discharging path portion |
|---|---|---|---|
| L1 | L2 | R1-D16-C1-C6-D23-R2 | R5-D1, D6-R10 |
| L1 | L3 | R1-D16-C1-C7-D22-R3 | R5-D1, D7-R11 |
| L1 | GND | R1-D16-C1-C8-D21-R4 | R5-D1, D8-R12 |
| L2 | L1 | R2-D15-C2-C5-D24-R1 | R6-D2, D5-R9 |
| L2 | L3 | R2-D15-C2-C7-D22-R3 | R6-D2, D7-R11 |
| L2 | GND | R2-D15-C2-C8-D21-R4 | R6-D2, D8-R12 |
| L3 | L1 | R3-D14-C3-C5-D24-R1 | R7-D3, D5-R9 |
| L3 | L2 | R3-D14-C3-C6-D23-R2 | R7-D3, D6-R10 |
| L3 | GND | R3-D14-C3-C8-D21-R4 | R7-D3, D8-R12 |
| GND | L1 | R4-D13-C4-C5-D24-R1 | R8-D4, D5-R9 |
| GND | L2 | R4-D13-C4-C6-D23-R2 | R8-D4, D6-R10 |
| GND | L3 | R4-D13-C4-C7-D22-R3 | R8-D4, D7-R11 |

It will be particularly appreciated that the various high impedance paths are rectifying paths. That is, current flows through different high impedance paths depending upon which line of a particular pair of lines is relatively positively charged, and which line of the particular pair of lines is relatively negatively charged.

Put another way, the rectifier diodes D13, D14, D15, D16 allow a positive potential on one of the corresponding input lines L1, L2, L3, GND to charge one of the respective capacitances C1, C2, C3, C4. Likewise, rectifier diodes D21, D22, D23, D24 allow a negative potential on one of the input lines L1, L2, L3, GND to charge one of the respective capacitances C5, C6, C7, C8. Each of the positive potential-responding capacitances C1, C2, C3, C4 of the first group 32 has a respective positive light emitting diode D1, D2, D3, D4 and each negative potential-responding capacitance C5, C6, C7, C8 of the second group 34 has a respective negative light emitting diode D5, D6, D7, D8. Each of the light emitting diodes D1, D2, D3, D4, D5, D6, D7, D8 has a corresponding series current-limiting resistor R5, R6, R7, R8, R9, R10, R11, R12. Two independent discharge or flasher circuits F1, F2 is with high "OFF" impedance and low "ON" impedance are coupled to the first and second (or positive and negative) groups 32, 34, respectively. The capacitances C1, C2, C3, C4 and corresponding light emitting diodes D1, D2, D3, D4 of the first or positive group 32 are in parallel so that when the flasher circuit F1 goes to a low or "ON" impedance, the stored energy on the capacitances C1, C2, C3, C4 is discharged through the corresponding light emitting diodes D1, D2, D3, D4. The second flasher circuit F2 operates on the negative responding components the same way.

A single d.c. potential between any two of the input lines L1, L2, L3, GND is indicated by one of the positive light emitting diodes D1, D2, D3, D4 of the first group 32 and by one of the negative light emitting diodes D5, D6, D7, D8 of the second group 34. Thus, a single d.c. potential between two lines is indicated by two flashing light emitting diodes.

An a.c. potential between any two of the input lines L1, L2, L3, GND produces a first half-cycle in which the two lines have a first polarity (that is, a first line being positive with respect to a second line), and a second half-cycle in which the two lines have a second and opposite polarity (that is, the second line being positive with respect to the first line). During the first half-cycle, the positive light emitting diode of the first line and the negative light emitting diode of the second line are having their respective capacitors charged. During the second half-cycle, the positive light emitting diode of the second line and the negative light emitting diode of the first line are having their respective capacitors charged. Hence, an a.c. potential between any two of the input lines L1, L2, L3, GND is indicated by flashing of both the positive light emitting diode and the negative light emitting diode of each of the two input lines, that is by a total of four flashing light emitting diodes.

Moreover, the rate of capacitance charging is related to a magnitude of the stored electrical potential, with the capacitance charging faster for higher stored electrical potential magnitudes. Hence, as the electrical potential magnitude increases, the frequency of capacitance discharging increases and the light emitting diodes pulse or flash faster. In one preferred embodiment, the light emitting diode flash rates are related to electrical potential magnitude as shown in Table II.

TABLE II

Flash rates for a preferred embodiment

| a.c. potential (3-phase line-to-line) | | d.c. potential | |
|---|---|---|---|
| Voltage | Flashes/sec | Voltage | Flashes/sec |
| <29 | 0 | <27 | 0 |
| 30 | 1.3 | 30 | 1.6 |
| 120 | 4.2 | 48 | 2.5 |
| 240 | 5.8 | 110 | 4.5 |
| 480 | 7.3 | 300 | 6.9 |
| 600 | 8.0 | 600 | 8.8 |
| 750 | 8.8 | 1000 | 9.1 |

It is therefore seen that the type of stored electrical energy potential (a.c. or d.c.), the polarity (for a d.c. potential), the lines on which the electrical energy potential resides, and an estimate of a magnitude of the electrical energy potential are all readily and intuitively identified by the electrical safety monitoring device 20 which employs the circuitry 30.

The circuitry 30 includes substantial redundancy. The first and second groups 32, 34 (that is, the positive and negative flasher-capacitor-light emitting diode circuits 32, 34) are independent, and so even in the event that one of the flasher circuits 32, 34 fails, the remaining flasher circuit remains operational and ensures that at one light emitting diode will flash for a d.c. potential, and at least two light emitting diodes will flash for an a.c. potential.

The circuitry 30 has an advantageous symmetrical configuration. The symmetry ensures proper operation for any three-phrase sequence. Additionally, if the input lines L1, L2, L3, GND are connected incorrectly, the circuitry 30 will still detect hazardous electrical energy potentials. However, incorrect connection of the lines may result in misidentification of lines carrying the electrical energy potentials. Furthermore, the symmetry facilitates straightforward adaptation of the circuitry 30 for monitoring of other types of panels and circuits.

Although the circuitry 30 is configured for visual monitoring via the light emitting diodes D1, D2, D3, D4, D5, D6, D7, D8, it is also contemplated to substitute or additionally include remote monitoring capability. For example, optocoupler inputs can be electrically arranged in series with the discharge circuits F1, F2 to produce optocoupler signals for electrically isolated remote monitoring. Placing optocoupler inputs in series with each flasher F1, F2 provides advantageous redundancy. The outputs of the optocouplers are preferably paralleled for monitoring by a PLC or other monitoring device. The solid state relay optocouplers produce a signal pulse responsive to each capacitor discharge that is communicated to the PLC or other remote monitoring device.

Figure 3:
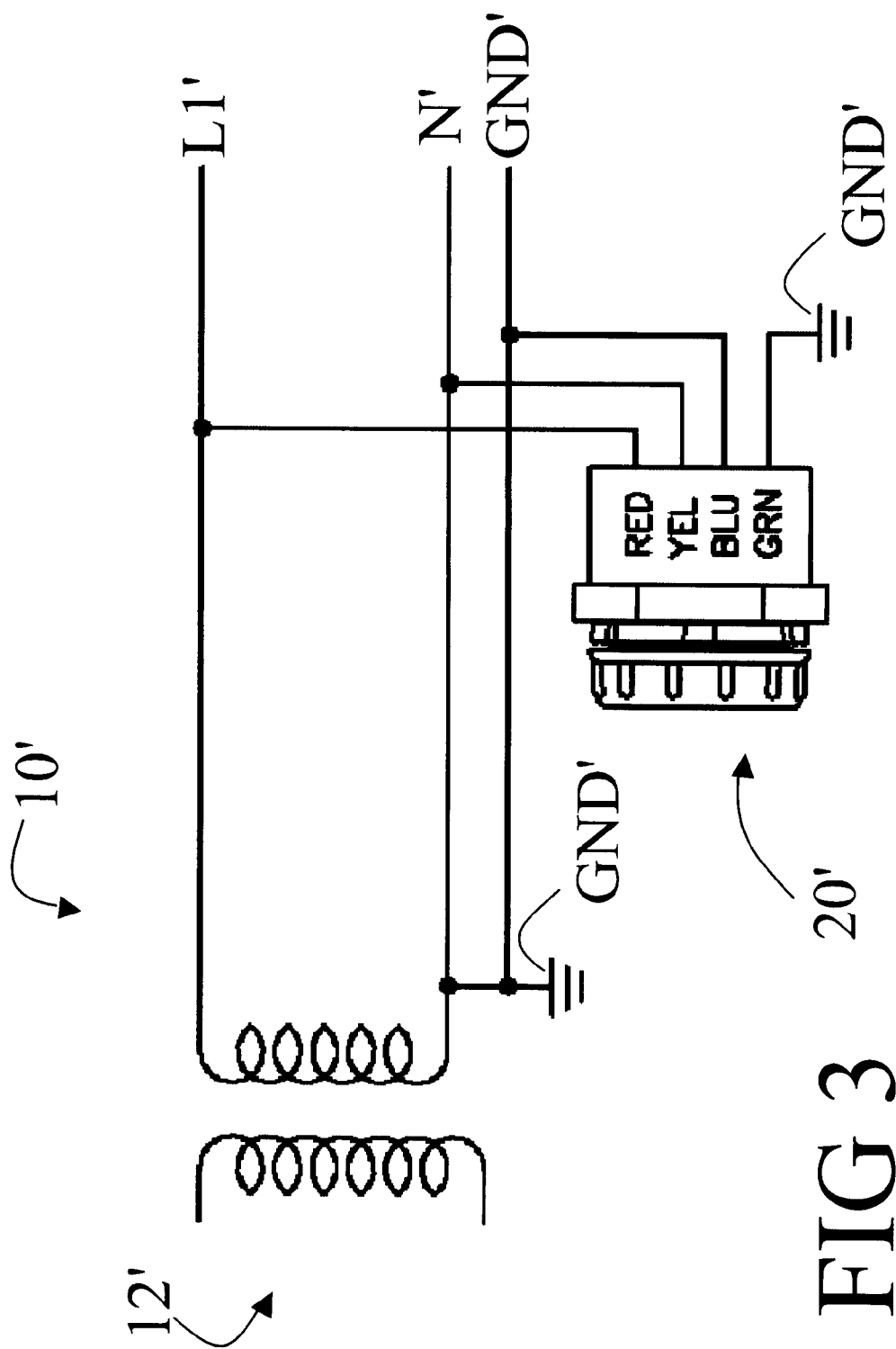
FIG. 3 shows an electrical schematic of a single-phase two-wire electrical power circuit under service, along with an electrical safety monitoring device.

With reference to FIG. 3, a circuit 10' includes a single-phase two-wire load 12' that is driven through power line L1' and neutral N' by single-phase power relative to a ground potential GND'. An electrical safety monitoring device 20' which is substantially similar to the monitoring device 20 and suitably includes the circuitry 30 monitors the circuit 10' for hazardous electrical energy potentials. Because the circuit 10' includes only three lines L1', N', GND', the L3 and GND input lines of the circuitry 30 are preferably both connected to the ground potential GND' in the electrical safety monitoring device 20'.

Alternatively, the electrical safety monitoring device 20' is modified relative to the electrical safety monitoring device 20 by removal of the high impedance path portions associated with one line. For example, the components R3, D14, C3, R7, D3, D22, C7, R11, D7 and associated wiring are optionally omitted.

Figure 4:
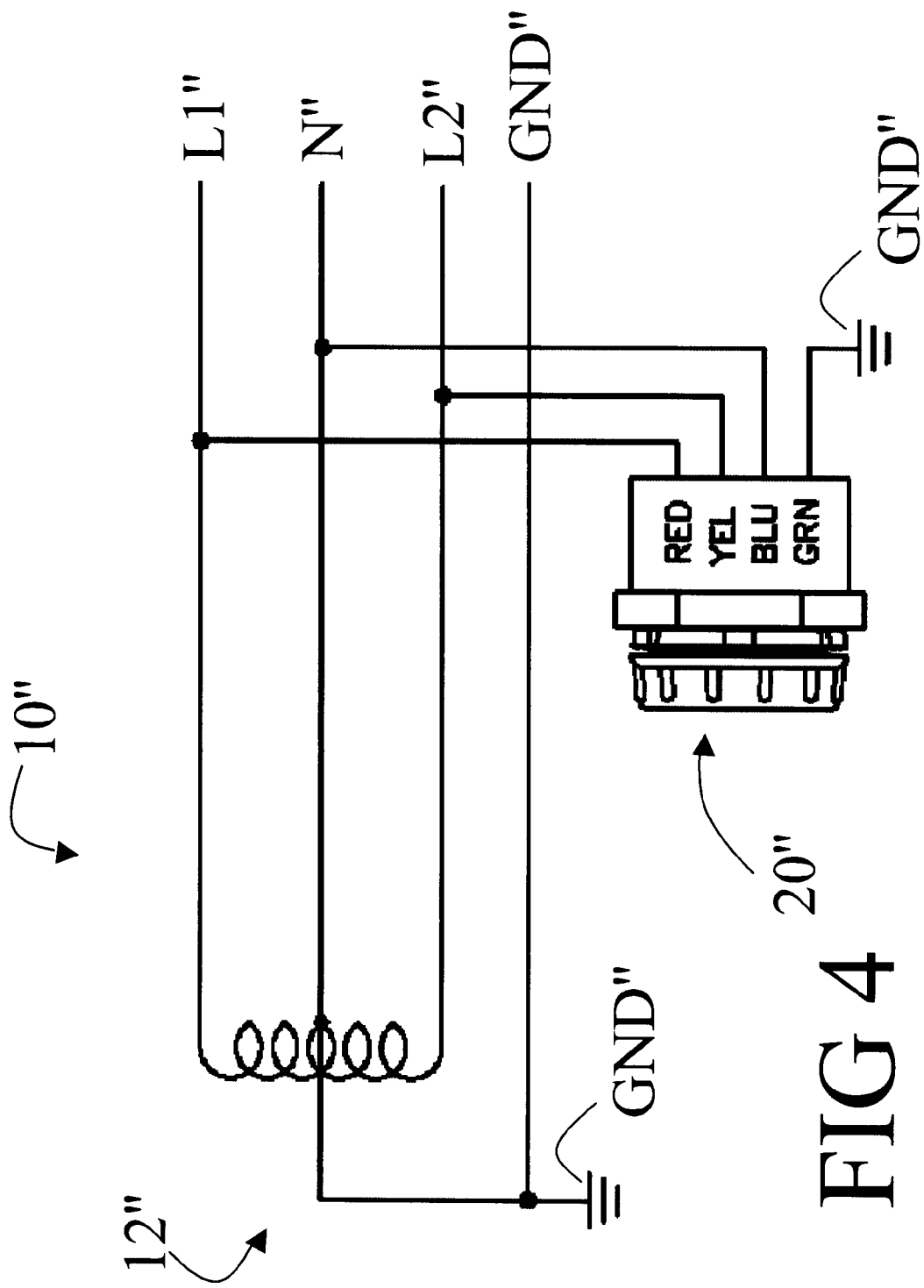
FIG. 4 shows an electrical schematic of a single-phase three-wire electrical power circuit under service, along with an electrical safety monitoring device.

With reference to FIG. 4, a circuit 10" includes a single-phase three-wire load 12" that is driven through differential power lines L1", L2" and neutral N" by single-phase power relative to a ground potential GND". An electrical safety monitoring device is 20" which is substantially similar to the monitoring device 20 and suitably includes the circuitry 30 monitors the circuit 10" for hazardous electrical energy potentials.

The monitoring applications shown in FIGS. 1, 3, and 4 are exemplary only. The symmetrical circuitry 30 is readily adapted to still yet other applications. For example, a three-phase load arranged in a "wye" configuration including three power lines, a neutral line, and a ground potential is suitably monitored by adding high impedance paths for a fifth input line to the circuitry 30. The added high impedance paths are electrically symmetrical to the existing high impedance paths between the input lines L1, L2, L3, GND. Similarly, additional high impedance paths for any number of input lines can be added to, for example, simultaneously monitor a bank of circuits accessed via a single circuit breaker panel.

Figure 5:
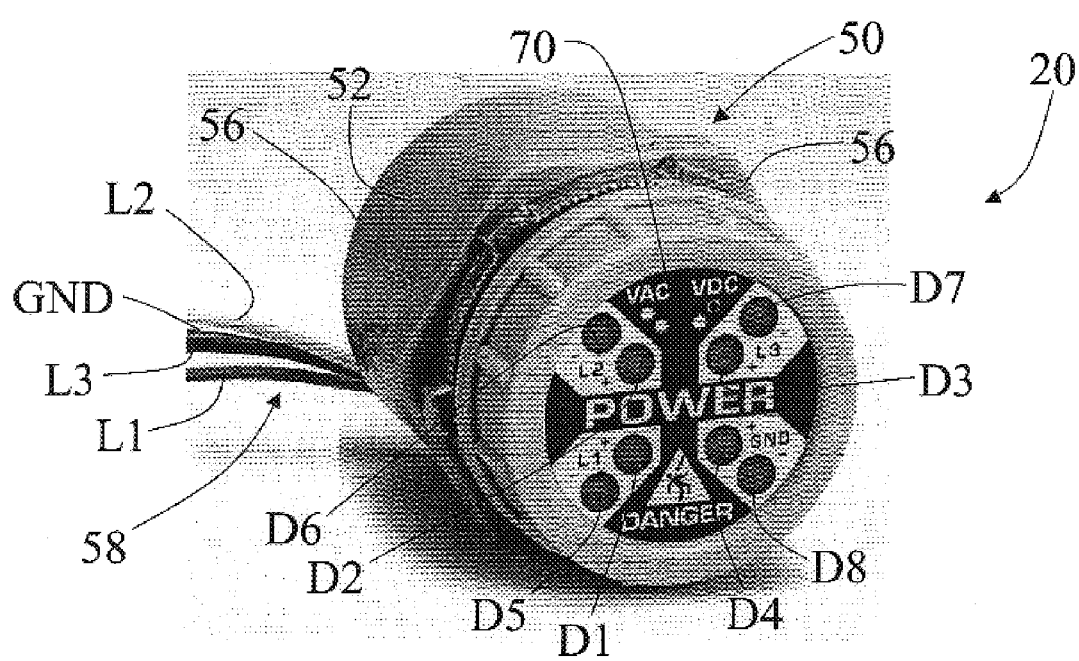
FIG. 5 shows a perspective view of the electrical safety monitoring device of FIG. 1.

With reference to FIGS. 5, 6A and 6B, a suitable housing and physical arrangement of the electrical safety monitoring device 20 is described. A housing 50 is configured to mount in a conventional electrical panel knockout, such as a standard 1¼ inch knockout conduit. The housing 50 includes a main body 52 that includes a threaded securing end 54 and a connector end 56. A connector pigtail 58 (shown in FIG. 5) extends from the connector end 56 and includes the input lines L1, L2, L3, GND. Preferably, the wires of the pigtail 58 are color-coded to facilitate proper connection. In the illustrated embodiment, the wires of the pigtail 58 are colored red, yellow, blue, and green for lines L1, L2, L3, and the ground line GND, respectively. These colors are also indicated in FIG. 1. As best seen in FIG. 6B, the threaded end 54 passes through a knockout conduit 60 defined by panel edges 62. A threaded cap 64 screws onto the threaded end 54 and cooperates with a locknut 66 to secure the housing 50 in the knockout conduit 60.

With particular reference to FIGS. 5 and 6A, the housing 50 includes a front face 70 on which the light emitting diodes D1, D2, D3, D4, D5, D6, D7, D8 are disposed in a convenient human-viewable arrangement. Preferably, the light emitting diodes are arranged with the positive and negative indicators (that is, the light emitting diode from the first or positive group 32 and the light emitting diode from the second or negative group 34) for each line grouped together. In the exemplary front face 70, the two light emitting diodes of each of the four input lines L1, L2, L3, GND are arranged along radial lines corresponding to the four lines, with the light emitting diodes D1, D2, D3, D4 of the positive or first group 32 arranged to form an inner set of indicators, and the light emitting diodes D5, D6, D7, D8 of the negative or second group 34 arranged to form an outer set of indicators.

The exemplary front face 70 also includes line markings "L1", "L2", "L3", and "GND" indicating the lines with which each light emitting diode is associated. Polarity marking "+" is associated with each light emitting diode D1, D2, D3, D4 of the first group 32. Polarity marking "−" is associated with each light emitting diode D5, D6, D7, D8 of the second group 34. A "VAC" schematic marking indicates that for an a.c. electrical energy potential both light emitting diodes of a line are flashing, while a "VDC" schematic marking indicates that for a d.c. electrical energy potential only one light emitting diode of a line is flashing.

FIGS. 7A and 7B show an alternative surface mount arrangement. A clamp bracket 80 clamps onto the main body 52 of the housing 50 The clamp bracket 80 includes mounting extensions 82 with openings 84 for fastening the clamp bracket 80 to a surface of a panel, an electrical box, or other electrical power component.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. An electrical safety monitor for monitoring electrical energy potentials of a plurality of electrical power input lines of an a.c. circuit, the electrical safety monitor including:
    a plurality of capacitors including:
        a plurality of positive capacitors corresponding to the plurality of electrical power input lines, each positive capacitor arranged to charge responsive to a positive electrical energy potential on the corresponding line, and a plurality of negative capacitors corresponding to the plurality of electrical power input lines, each negative capacitor arranged to charge responsive to a negative electrical energy potential on the corresponding line;

a discharge circuit electrically communicating with the plurality of capacitors to cause a capacitor discharge at a predetermined capacitor voltage; and a plurality of solid-state light-emitting devices disposed in a human-viewable arrangement, each light emitting device electrically communicating with a selected capacitor and producing a light output responsive to capacitor discharge of the corresponding capacitor.

2. The electrical safety monitor as set forth in claim 1, wherein the solid-state light-emitting devices include light emitting diodes.

3. The electrical safety monitor as set forth in claim 1, wherein the light output from the corresponding light emitting device pulses responsive to periodic capacitor discharge, and a pulse rate of the light emitting device is indicative of a magnitude of the electrical energy potential on the corresponding electrical power input line.

4. The electrical safety monitor as set forth in claim 1, further including:

an optocoupler including an optocoupler input that is electrically arranged in series with the discharge circuit, the optocoupler producing an output responsive to the capacitor discharge that is communicated to a remote monitoring device.

5. The electrical safety monitor as set forth in claim 1, wherein:

two light emitting devices produce light output responsive to a d.c. electrical energy potential between two electrical power input lines; and four light emitting devices produce light output responsive to an a.c. electrical energy potential between two electrical power input lines.

6. The electrical safety monitor as set forth in claim 1, wherein the electrical power input lines include three phase lines of a three-phase circuit and a ground line, and the plurality of capacitors include:

a positive capacitor corresponding to each of the three phase lines a negative capacitor corresponding to each of the three phase lines;

a positive capacitor corresponding to the ground line; and a negative capacitor corresponding to the ground line.

7. The electrical safety monitor as set forth in claim 1, wherein the electrical power input lines include a single phase line, a neutral line, and an electrical ground line, and the plurality of capacitors include:

positive and negative capacitors corresponding to each of the single phase line, the neutral line, and the electrical ground line.

8. The electrical safety monitor as set forth in claim 1, further including:

a housing on which the plurality of solid-state light-emitting devices are disposed, the housing including a securing end that attaches to a panel knockout of a panel that accesses the electrical power input lines.

9. The electrical safety monitor as set forth in claim 1, further including:

electrical conditioning circuitry that convert electrical energy potentials between the lines in a range of about 30 volts to about 1000 volts into electrical inputs that drive the solid-state light-emitting devices to produce light output.

10. A method for providing warning of a hazardous electrical voltage on a circuit, the method including:

arranging high impedance rectifying paths between electrical lines of the circuit, the high impedance rectifying paths including light emitting devices, each light emitting device producing light responsive to a current flowing in a high impedance rectifying path that includes the light emitting device;

monitoring a display that includes the light emitting devices to detect a d.c. hazardous electrical voltage; and determining a polarity of the d.c. hazardous electrical voltage based on which light emitting devices produce light.

11. The method as set forth in claim 10, further including:

modulating the current flowing in a high impedance rectifying path based on a magnitude of the d.c. hazardous electrical voltage; and during the monitoring, estimating the magnitude of the d.c. hazardous electrical voltage based on a corresponding modulation of the light produced by the light emitting devices.

12. The method as set forth in claim 10, wherein the arranging of high impedance rectifying paths between electrical lines of the circuit includes:

installing a housing containing the high impedance rectifying paths and the display in a panel knockout; and connecting leads that extend from the housing and that communicate with the high impedance rectifying paths to the electrical lines of the circuit.

13. An electrical safety monitor for providing warning of a hazardous electrical voltage on a circuit powered by a plurality of electrical power input lines, the safety monitor including:

a plurality of first high impedance rectifying paths corresponding to the plurality of electrical power input lines, each first high impedance rectifying path arranged to conduct current from the corresponding electrical power input line to a common electrical node;

a plurality of second high impedance rectifying paths corresponding to the plurality of electrical power input lines, each second high impedance rectifying path arranged to conduct current from the common electrical node to the corresponding electrical power input line;

a plurality of first light emitting devices corresponding to the plurality of first high impedance rectifying paths, each first light emitting device electrically communicating with the corresponding first high impedance rectifying path to emit light responsive to a current flowing through the corresponding first high impedance rectifying path; and a plurality of second light emitting devices corresponding to the plurality of second high impedance rectifying paths, each second light emitting device electrically communicating with the corresponding second high impedance rectifying path to emit light responsive to a current flowing through the corresponding second high impedance rectifying path.

14. The safety monitor as set forth in claim 13, further including:

a housing including a display face on which the first and second pluralities of light emitting devices are arranged and a securing section that connects with an electrical panel.

15. The electrical safety monitor as set forth in claim 14, wherein the first plurality of light emitting devices and the second plurality of light emitting devices are arranged on the display face of the housing in a pattern which distinguishes light emitting devices associated with each power input line from light emitting devices associated with other power input lines.

16. The electrical safety monitor as set forth in claim 14, wherein the securing section of the housing includes:
   a threaded section that fastens the housing in a panel knockout of the electrical panel.

17. The electrical safety monitor as set forth in claim 13, wherein the electrical circuitry further includes:
   a capacitance associated with each light emitting device, the capacitance charging responsive to current flowing in the high impedance path that corresponds to the light emitting device; and
   a flasher circuit that discharges the capacitance which has charged to a selected voltage, the discharging energizing the corresponding light emitting device and causing it to produce a flash of light.

18. The electrical safety monitor as set forth in claim 13, wherein the plurality of electrical power input lines include three phase lines and a ground line, the first high impedance rectifying paths include four paths arranged to conduct current from the three phase lines and the ground line to the common electrical node, and the second high impedance rectifying paths include four paths arranged to conduct current from the common electrical node to the three phase lines and the ground line.

19. The electrical safety monitor as set forth in claim 13, wherein the plurality of electrical power input lines include a single-phase line, a neutral line, and a ground line, the first high impedance rectifying paths include three paths arranged to conduct current from the single-phase, neutral, and ground lines to the common electrical node, and the second high impedance rectifying paths include three paths arranged to conduct current from the common electrical node to the single-phase, neutral, and ground lines.

20. The electrical safety monitor as set forth in claim 13, wherein the plurality of electrical power input lines include two differential single-phase lines, a neutral line, and a ground line, the first high impedance rectifying paths include four paths arranged to conduct current from each of the differential single-phase lines, the neutral line, and the ground line to the common electrical node, and the second high impedance rectifying paths include four paths arranged to conduct current from the common electrical node to each of the differential single-phase lines, the neutral line, and the ground line.

21. The electrical safety monitor as set forth in claim 13, wherein the plurality of electrical power input lines includes a ground line.

22. The electrical safety monitor as set forth in claim 13, further including:
   a first flasher circuit, the plurality of first rectifying paths being coupled to the first flasher circuit through the plurality of first light emitting devices, each of the first rectifying paths including a capacitance that charges responsive to current flow therethrough, said capacitance being discharged at a selected voltage by the first flasher circuit by current flow through the corresponding light emitting device such that said light emitting device emits light; and
   a second flasher circuit, the plurality of second rectifying paths being coupled to the second flasher circuit through the plurality of second light emitting devices, each of the second rectifying paths including a capacitance that charges responsive to current flow therethrough, said capacitance being discharged at a selected voltage by the second flasher circuit by current flow through the corresponding light emitting device such that said light emitting device emits light.

23. An electrical safety monitor for indicating that power remains on one or more of a plurality of electrical lines, the electrical safety monitor including:
   a plurality of light emitting means, each light emitting means connected between one of:
      two of the plurality of electrical lines downstream of a power disconnect means for disconnecting at least the a.c. electrical lines from a source of electrical power, and
      an earth ground and one of the plurality of electrical lines downstream of the power disconnect means,
   such that one of:
      power remaining on any one of the electrical lines downstream of the power disconnect means, and
      a hazardous stored electrical potential remaining on any one of the electrical lines downstream of the power disconnect means,
   after the power disconnect means has disconnected the electrical line from the source of power causes the light emitting means to emit light.

24. The electrical safety monitor as set forth in claim 23, wherein each light emitting means includes:
   a rectifying capacitive electrical path, the capacitive path developing a capacitance voltage responsive to electrical current flow; and
   a light emitting device connecting the electrical path with a discharge circuit, the discharge circuit discharging the capacitive voltage when said voltage reaches a threshold voltage, the discharging causing operative current flow through the light emitting device.

* * * * *